United States Patent
Kim (10) Patent No.: US 10,928,966 B2
(45) Date of Patent: *Feb. 23, 2021

(54) TOUCH PANEL AND TOUCH-PANEL-INTEGRATED ORGANIC LIGHT-EMITTING DISPLAY DEVICE HAVING TOUCH ELECTRODES WITH FLOATING UNITS

(71) Applicant: LG Display Co., Ltd., Seoul (KR)

(72) Inventor: Yong-Chul Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/677,218

(22) Filed: Nov. 7, 2019

(65) Prior Publication Data

US 2020/0073503 A1  Mar. 5, 2020

Related U.S. Application Data (63) Continuation of application No. 15/691,255, filed on Aug. 30, 2017, now Pat. No. 10,503,294.

(30) Foreign Application Priority Data

Aug. 31, 2016  (KR) .......................... 10-2016-0112212

(51) Int. Cl.
  *G06F 3/041*  (2006.01)
  *G06F 3/044*  (2006.01)
  *H01L 27/32*  (2006.01)

(52) U.S. Cl.
  CPC .......... *G06F 3/0446* (2019.05); *G06F 3/0412* (2013.01); *H01L 27/323* (2013.01);
  (Continued)

(58) Field of Classification Search
  CPC ... H01L 27/323; H01L 27/3244; G06F 3/044; G06F 2203/04111; G06F 2203/04112
  See application file for complete search history.

(56) References Cited

U.S. PATENT DOCUMENTS 9,703,426 B2   7/2017  Yao et al.
2010/0302201 A1  12/2010  Ritter et al.
(Continued)

FOREIGN PATENT DOCUMENTS

CN  103294293 A  9/2013

OTHER PUBLICATIONS

China National Intellectual Property Administration, Notification of the First Office Action, CN Patent Application No. 201710762662.6, Apr. 20, 2020, 15 pages.
(Continued)

*Primary Examiner* — Kwang-Su Yang
(74) *Attorney, Agent, or Firm* — Fenwick & West LLP (57) ABSTRACT

Disclosed herein are a touch panel and a touch-panel-integrated organic light-emitting display device that are capable of solving a retransmission problem while exhibiting excellent luminance and color viewing angle characteristics. The touch panel includes a plurality of first and second electrodes disposed on a substrate so as to intersect each other. Each first electrode includes a first touch electrode, the first touch electrode including a first metal mesh pattern having a lattice structure formed by a plurality of first and second line electrodes intersecting each other and a first floating unit disposed in the central part of the first metal mesh pattern, the first floating unit being electrically isolated from the first metal mesh pattern, the first floating unit being made of a transparent conductive material. Each second electrode includes a second touch electrode, the second touch electrode including a second metal mesh pattern
(Continued)

formed by a plurality of third and fourth line electrodes intersecting each other in a lattice structure and a second floating unit disposed in the central part of the second metal mesh pattern, the second floating unit being electrically isolated from the second metal mesh pattern, the second floating unit being made of a transparent conductive material.

11 Claims, 9 Drawing Sheets

(52) U.S. Cl.
CPC ............... *G06F 2203/04111* (2013.01); *G06F 2203/04112* (2013.01); *H01L 27/3244* (2013.01)

(56) References Cited

U.S. PATENT DOCUMENTS

| | | | |
|---|---|---|---|
| 2011/0018838 A1* | 1/2011 | Lee | G06F 3/044 345/174 |
| 2012/0212449 A1 | 8/2012 | Kuriki | |
| 2012/0312677 A1 | 12/2012 | Kuriki | |
| 2013/0207911 A1* | 8/2013 | Barton | H03K 17/962 345/173 |
| 2013/0341651 A1 | 12/2013 | Kim et al. | |
| 2014/0078106 A1 | 3/2014 | Yao et al. | |
| 2014/0152912 A1* | 6/2014 | Lee | G06F 3/0412 349/12 |
| 2015/0062457 A1 | 3/2015 | Kida et al. | |
| 2015/0153873 A1 | 6/2015 | Lee et al. | |
| 2015/0220179 A1 | 8/2015 | Kimura | |
| 2016/0070406 A1 | 3/2016 | Han et al. | |
| 2016/0117031 A1 | 4/2016 | Han et al. | |
| 2016/0170524 A1 | 6/2016 | Kim et al. | |

OTHER PUBLICATIONS

European Patent Office, Extended European Search Report and Opinion, EP Patent Application No. 17188647.6, dated Jan. 19, 2018, ten pages.

United States Office Action, U.S. Appl. No. 15/691,255, dated Apr. 4, 2019, 19 pages.

* cited by examiner

TOUCH PANEL AND TOUCH-PANEL-INTEGRATED ORGANIC LIGHT-EMITTING DISPLAY DEVICE HAVING TOUCH ELECTRODES WITH FLOATING UNITS

CROSS-REFERENCE TO RELATED APPLICATIONS

This patent application is a continuation of U.S. patent application Ser. No. 15/691,255 filed Aug. 30, 2017 which claims the benefit of Republic of Korea Patent Application No. 10-2016-0112212, filed on Aug. 31, 2016, each of which is hereby incorporated by reference in its entirety.

BACKGROUND

Field of Technology

The present disclosure relates to a touch panel and a touch-panel-integrated organic light-emitting display device, and more particularly to a touch panel that reduces a retransmission phenomenon and has high luminance and a wide viewing angle when applied to a display device, and a touch-panel-integrated organic light-emitting display device.

Discussion of the Related Art

Image display devices, which are a core technology in the information communication age, for displaying various kinds of information on a screen, have been developed such that the image display devices are thinner, lighter, and portable, and exhibit high performance. In addition, organic light-emitting display devices, which control the amount of light that is emitted from an organic light-emitting layer to display an image, have been highlighted as flat panel display devices, which have lower weight and volume than cathode ray tubes (CRT).

Using a self-emitting organic light-emitting device, an organic light-emitting display device does not need an additional light source, and may be realized as an ultra-thin display device. In recent years, therefore, research has been actively conducted into an in-cell touch type touch-panel-integrated display device, which uses an organic light-emitting device and includes a touch electrode array in a light-emitting cell.

An in-cell touch type touch panel includes a first touch electrode disposed in a first direction and a second touch electrode disposed in a second direction so as to intersect the first touch electrode. The first and second touch electrodes are electrically isolated from each other. The touch panel senses a touch input by sensing a change of mutual capacitance between the first and second touch electrodes when an object having static electricity comes into contact with the touch panel.

As the thickness of the touch panel is reduced, the thickness of a cover part that covers the upper surface of the touch panel may also be reduced. As a result, the distance between the first and second touch electrodes and a user's finger is reduced. At this time, parasitic capacitance between the first and second touch electrodes and the user's finger is increased. A retransmission phenomenon in which an unintended touch signal is generated due to such parasitic capacitance occurs, with the result that touch sensitivity is lowered and malfunctions are caused.

Meanwhile, research has been actively conducted into the application of a metal mesh pattern exhibiting high flexibility and low resistance to a touch electrode in manufacturing an organic light-emitting display device having a flexible in-cell touch structure. Since such a metal mesh pattern exhibits higher reflexibility than a transparent conductive material, however, the metal mesh pattern is easily visible to the outside, with the result that the overall luminance of the organic light-emitting display device is reduced. In order to solve this problem, there has been proposed a method of aligning the metal mesh pattern with a bank, which is a non-emitting region. However, the metal mesh pattern may be misaligned with the display panel. In addition, even when the metal mesh pattern is accurately aligned with the display panel, the metal mesh pattern is visible when the viewing angle is increased. Consequently, it is difficult to secure excellent color viewing angle characteristics of the organic light-emitting display device.

SUMMARY

Accordingly, the present disclosure is directed to a touch panel and a touch-panel-integrated organic light-emitting display device that substantially obviate one or more problems due to limitations and disadvantages of the related art.

An object of the present disclosure is to provide a touch panel and a touch-panel-integrated organic light-emitting display device that are capable of solving a retransmission problem while exhibiting excellent luminance and color viewing angle characteristics.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a touch panel includes a plurality of first and second electrodes disposed on a substrate so as to intersect each other.

Each first electrode may include a first touch electrode, the first touch electrode including a first metal mesh pattern having a lattice structure formed by a plurality of first and second line electrodes intersecting each other and a first floating unit disposed in the central part of the first metal mesh pattern, the first floating unit being electrically isolated from the first metal mesh pattern, the first floating unit being made of a transparent conductive material.

Each second electrode may include a second touch electrode, the second touch electrode including a second metal mesh pattern formed by a plurality of third and fourth line electrodes intersecting each other in a lattice structure and a second floating unit disposed in the central part of the second metal mesh pattern, the second floating unit being electrically isolated from the second metal mesh pattern, the second floating unit being made of a transparent conductive material.

First touch electrodes adjacent to each other in the first direction may be connected to each other via a bridge, and second touch electrodes adjacent to each other in the second direction may be connected to each other via a connection mesh pattern.

The first and second floating units may be made of a material different from that of the first and second metal mesh pattern. For example, each of the first and second floating units may include transparent conductive patterns arranged while intersecting in the third and fourth directions. A third segment electrode may be further provided between the transparent conductive patterns. The third segment electrode may be integrally formed with the transparent conductive patterns.

The touch panel according to the present invention may further include a first segment electrode disposed in a contact fashion at the intersection of the first and second line electrodes and a second segment electrode disposed in a contact fashion at the intersection of the third and fourth line electrodes. Each of the first and second segment electrodes may be made of a transparent conductive material.

The touch panel may further include an interlayer dielectric film disposed to cover the first and second electrodes. The interlayer dielectric film may be provided with a plurality of contact holes, through which a portion of the edge region of the first metal mesh pattern is exposed. The bridge may electrically connect two first metal mesh patterns adjacent to each other in the first direction through the contact holes.

The bridge may be formed so as to overlap the connection mesh pattern and the second metal mesh pattern.

Meanwhile, a fourth segment electrode may be further provided on the connection mesh pattern.

In addition, the first metal mesh pattern may further include at least one protrusion protruding from a region thereof adjacent to the second metal mesh pattern toward the second metal mesh pattern, the protrusion having an intersection of the first and second line electrodes. A fifth segment electrode may be further provided in a contact fashion at the intersection of the protrusions.

In addition, the touch panel may further include at least one floating segment electrode disposed at the interface between the first and second metal mesh patterns, the floating segment electrode being configured to electrically float, the floating segment electrode being made of a transparent conductive material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it may obscure the subject matter of the present invention. In addition, the terms used in the following description are selected in consideration of ease of preparation of the specification, and may be different from the names of parts constituting an actual product.

It will be understood that when an element is referred to as being "on" another element, it may be directly on the element, or one or more intervening layers or elements may also be present therebetween. In contrast, it will be understood that when an element is referred to as "contacting" another element, no intervening elements or layers are present therebetween.

The size and thickness of each element shown in the drawings are given merely for the convenience of description, and the present invention is not limited thereto.

Hereinafter, a display device including a touch panel according to the present invention will be described with reference to the accompanying drawings.

Figure 1:
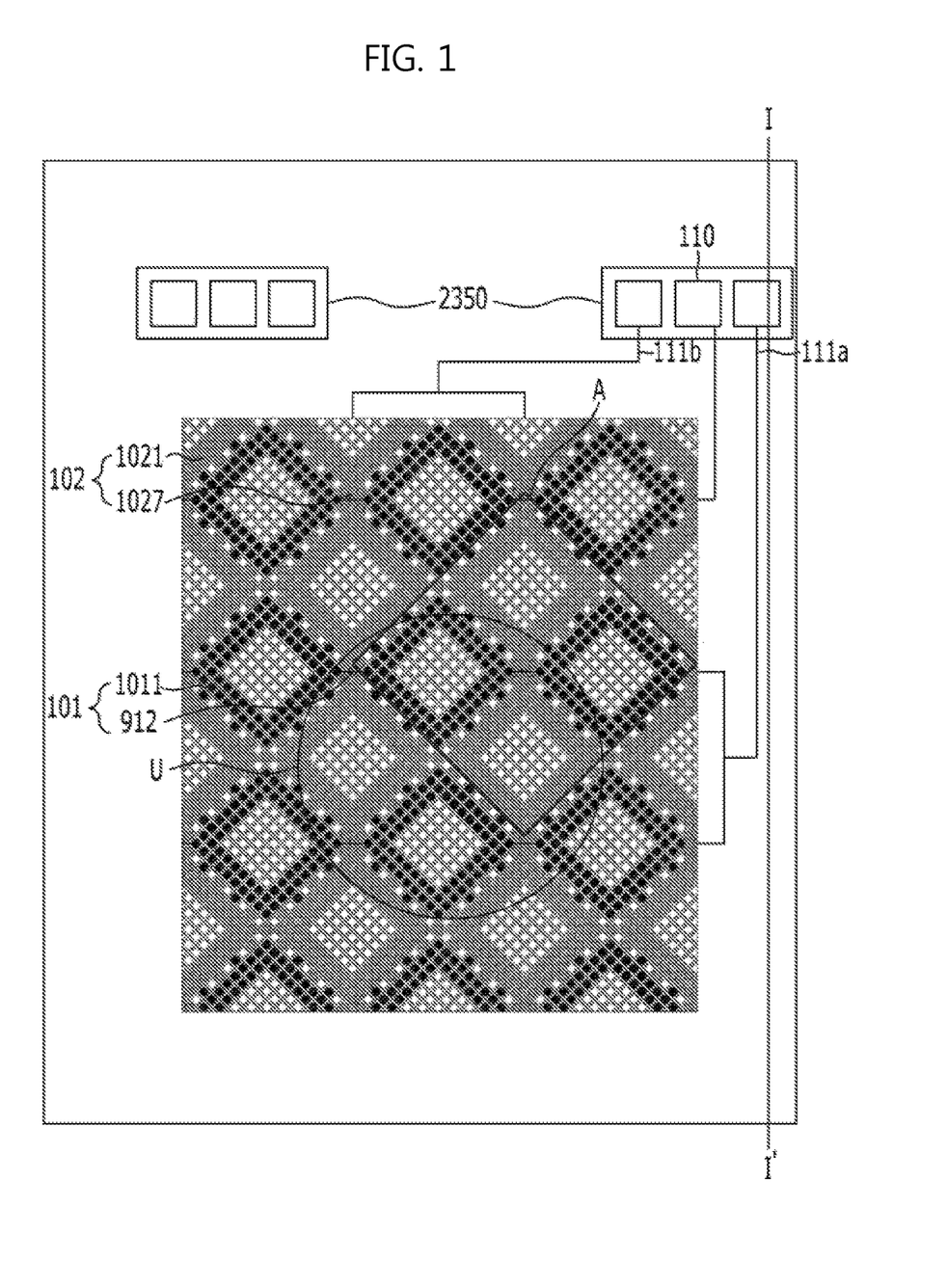
FIG. 1 is a schematic plan view showing a display device including a touch panel according to one embodiment of the present disclosure.

FIG. 1 is a schematic plan view showing a display device including a touch panel according to the present disclosure.

The touch panel according to the present disclosure includes a plurality of first electrodes 101 arranged on a substrate 1000 in the first direction and a plurality of second electrodes 102 arranged in the second direction, which intersects the first direction. In this embodiment, the first direction is illustrated as being the horizontal direction, and the second direction is illustrated as being the vertical direction. However, the present invention is not limited thereto.

The first electrodes 101 include first touch electrodes 1011 continuously arranged in the first direction. Adjacent ones of the first touch electrodes 1011 in the first direction are connected to each other via bridges 912. In addition, the second electrodes 102 include second touch electrodes 1021 and connection mesh patterns 1027 continuously arranged in the second direction. The first electrodes 101 including the first touch electrodes 1011 may function as touch electrodes for applying a touch signal, and the second electrodes 102 including the second touch electrodes 1021 may function as sensing electrodes for sensing the touch signal. However, the present invention is not limited thereto.

The first and second touch electrodes 1011 and 1021 and the connection relationship therebetween will be described below in detail.

The first electrodes 101 are connected to a pad electrode 110 of a touch pad unit 2350 via first routing lines 111a, and the second electrodes 102 are connected to the pad electrode 110 of the touch pad unit 2350 via second routing lines 111b. In this embodiment, a pair of first electrodes 101 adjacent to each other in the vertical direction is connected in parallel to one of the first routing lines 111a so as to be commonly connected to the pad electrode 110, and a pair of second electrodes 102 adjacent to each other in the horizontal direction is connected in parallel to one of the second routing lines 111b so as to be commonly connected to the pad electrode 110. However, the present invention is not limited thereto. In the case in which the first and second electrodes 101 and 102 are connected to the pad electrode 110 in pairs, as described above, a pair of first touch electrodes 1011 and a pair of second touch electrodes 1021 disposed at the intersection with the pair of first touch electrodes 1011 is driven as a unit sensor U for sensing one set of touch coordinates.

Figure 2:
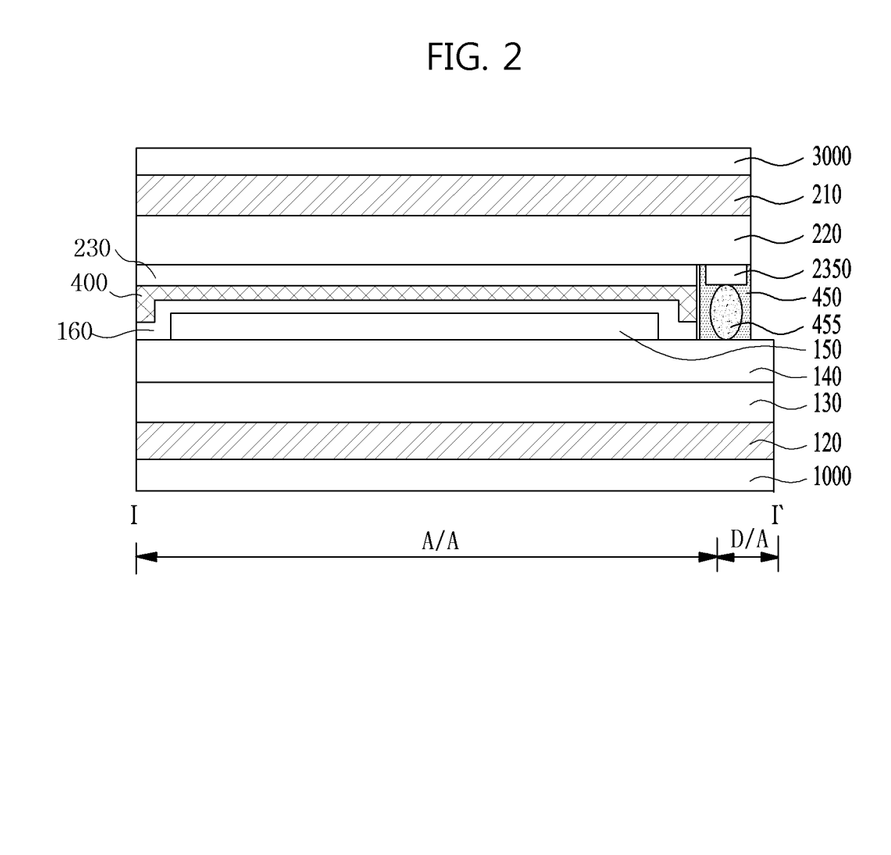
FIG. 2 is a schematic sectional view taken along line I-I' of FIG. 1 according to one embodiment of the present disclosure.

FIG. 2 is a schematic sectional view taken along line I-I' of FIG. 1.

The display device according to the present disclosure is configured to have an in-cell structure in which a touch electrode array 230 is realized in a display panel. In this embodiment, an organic light-emitting display device having an in-cell structure is described by way of example. However, the present invention is not limited thereto. The display device according to the present disclosure is configured such that a first substrate 120, a first buffer layer 130, a thin film transistor array 140, and an organic light-emitting array 150 are sequentially disposed on the substrate 1000 and such that a passivation layer 160 is provided to cover the organic light-emitting array 150. A second substrate 210, a second buffer layer 220, and a touch electrode array 230 are disposed inside a cover glass 3000. The touch electrode array 230 is laminated to the passivation layer 160, which is disposed on the organic light-emitting array 150, via a bonding layer 400 so as to be opposite the organic light-emitting array 150.

Each of the first buffer layer 130 and the second buffer layer 220 includes an active region and a dead region. The touch electrode array 230, the organic light-emitting array 150, and the thin film transistors in the thin film transistor array 140, excluding a pad unit, are formed in the active region. The touch pad unit and the pad unit of the thin film transistor array are formed in a portion of the dead region.

The first and second substrates 120 and 210 function to prevent damage to the arrays therein during a laser-application or etching process. According to circumstances, the substrate 1000 and the cover glass 3000 are removed, and the first and second substrates 120 and 210 function to protect the display device from the outside. Each of the first and second substrates 120 and 210 may be made of a polymer material, such as polyimide or photoacryl.

Each of the first buffer layer 130 and the second buffer layer 220 is formed by continuously stacking the same kind of inorganic films, such as oxide films ($SiO_2$) or nitride films ($SiN_x$), or by alternately stacking different kinds of inorganic films. Each of the first buffer layer 130 and the second buffer layer 220 functions as a barrier for preventing moisture or external air from permeating into the organic light-emitting array 150 in a subsequent process of laminating an upper substrate to a lower substrate.

The touch electrode array 230 and the touch pad unit 2350 are formed in the same surface of the second buffer layer 220. The touch pad unit 2350 is connected to a pad unit (not shown) of the thin film transistor array 140 via a seal 450 including a conductive ball 455 during an upper and lower laminating process using the bonding layer 400. The bonding layer 400 has a permeation prevention function. In addition, the bonding layer 400 directly contacts the passivation layer 160, which covers the organic light-emitting array 150. Consequently, the bonding layer 400 functions to more securely prevent external air and moisture from permeating into the organic light-emitting array 150, in addition to the function of the passivation layer 160.

The thin film transistor array 140, including the pad unit, is formed such that one side thereof protrudes further than the touch electrode array 230. The reason for this is that a drive integrated circuit (IC) (not shown) for transmitting a signal for simultaneously driving the touch electrode array, the thin film transistor array, and the organic light-emitting array is provided at the protruding portion thereof. Although not shown, a thin film transistor array driving pad and dummy pads include a plurality of dummy electrodes, which are connected to the drive IC via wires. After the glass is removed, the drive IC is connected to a flexible printed circuit board (FPCB) by bonding so as to be controlled by a micro control unit (MCU) (not shown) and a timing controller (not shown) provided at the FPCB. The dummy pads are formed in the portion of the dead region outside the active region that corresponds to the touch pad unit on the same layer as metal constituting a gate line or a data line.

A drive circuit may be mounted on the flexible printed circuit board or an anisotropic conductive film (ACF) using a chip-on-film (COF) method.

Although not shown, the thin film transistor array driving pad and the dummy pads are connected to each other via wires (not shown) formed on the flexible printed circuit board or the lower substrate 1000. In addition, the flexible printed circuit board may be further provided with a controller (not shown) for controlling the drive circuit.

The dummy pads are formed in the portion of the dead region outside the active region that corresponds to the touch pad unit on the same layer as the metal constituting the gate line or the data line.

Figure 3:
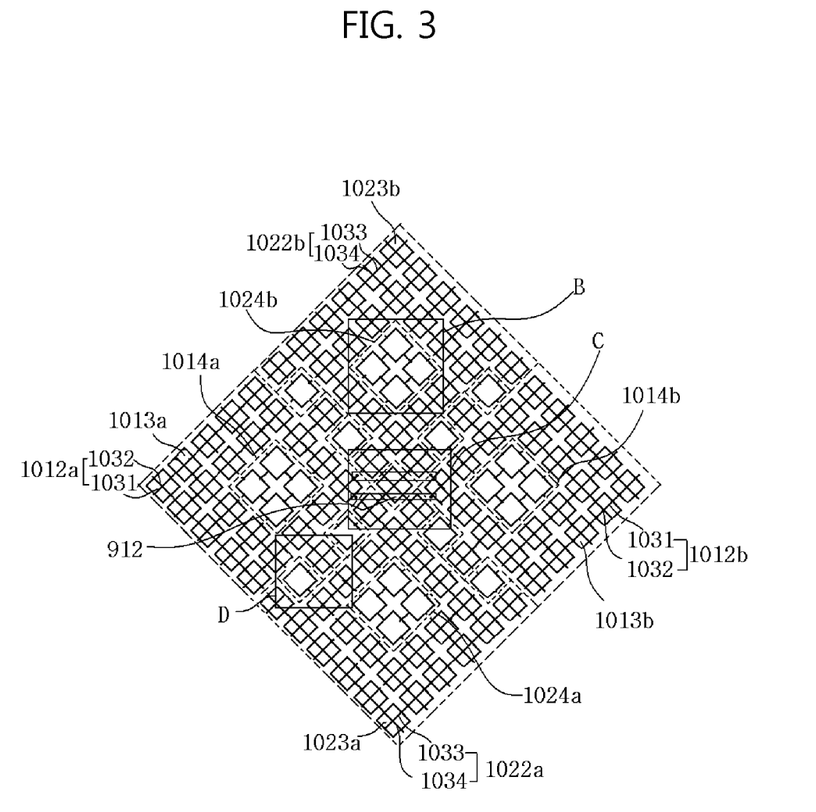
FIG. 3 is a detailed view showing part A of FIG. 1, illustrating the shape and connection relationship of first and second touch electrodes according to one embodiment of the present disclosure.

FIG. 3 is a detailed view showing part A of FIG. 1, illustrating the shape and connection relationship of the first and second touch electrodes 1011 and 1021.

The first touch electrode 1011 according to the present disclosure includes first metal mesh patterns 1012a and 1012b having a lattice structure formed by a plurality of first line electrodes 1031 and second line electrodes 1032 intersecting in the third and fourth directions and first floating units 1014a and 1014b disposed in the central parts of the first metal mesh patterns 1012a and 1012b so as to be electrically isolated from the first metal mesh patterns 1012a and 1012b. The first floating units 1014a and 1014b may be made of a material different from that of the first metal mesh patterns 1012a and 1012b. For example, the first floating units 1014a and 1014b may be made of a transparent conductive material, such as indium tin oxide (ITO), indium zinc oxide (IZO), indium gallium zinc oxide (IGZO), or (ZnO). However, the present invention is not limited thereto.

The first metal mesh pattern 1012*a*, which is disposed on one side, and the first metal mesh pattern 1012*b*, which is disposed on the other side, adjacent thereto in the first direction are electrically connected to each other via a bridge 912.

First segment electrodes 1013*a* and 1013*b* may be further provided in a contact fashion at the intersection of the first and second line electrodes 1031 and 1032 in the third and fourth directions. The first segment electrodes 1013*a* and 1013*b* may be omitted depending on the design.

The second touch electrode 1021 according to the present disclosure includes second metal mesh patterns 1022*a* and 1022*b* having a lattice structure formed by a plurality of third line electrodes 1033 and fourth line electrodes 1034 intersecting in the third and fourth directions and second floating units 1024*a* and 1024*b* disposed in the central parts of the second metal mesh patterns 1022*a* and 1022*b* so as to be electrically isolated from the second metal mesh patterns 1022*a* and 1022*b*. Like the first floating units 1014*a* and 1014*b*, the second floating units 1024*a* and 1024*b* may be made of a material different from that of the second metal mesh patterns 1022*a* and 1022*b*. For example, the second floating units 1024*a* and 1024*b* may be made of a transparent conductive material, such as ITO, IZO, IGZO, or ZnO. However, the present invention is not limited thereto.

The first touch electrode 1011 and the second touch electrode 1021 of the touch electrode array 230 according to the embodiment of the present disclosure are formed on the same layer so as to be electrically isolated from each other. However, the present invention is not limited thereto.

In this embodiment, the third and fourth directions are diagonal directions. However, the present invention is not limited thereto.

The second metal mesh pattern 1022*a*, which is disposed on one side, and the second metal mesh pattern 1022*b*, which is disposed on the other side, adjacent thereto in the second direction are electrically connected to each other via a connection mesh pattern, a description of which will follow.

Second segment electrodes 1023*a* and 1023*b* may be further provided in a contact fashion at the intersection of the second metal mesh patterns 1022*a* and 1022*b* in the first and second directions. The second segment electrodes 1023*a* and 1023*b* may also be omitted depending on the design.

Each of the first and second touch electrodes 1011 and 1021 according to the embodiment of the present disclosure has a diamond shape. Each of the first and second metal mesh patterns 1012 and 1022 and the first and second floating units 1014 and 1024 also has a diamond shape. The diamond shape may be changed depending on the structure of each pixel of the display panel. When each pixel of the display panel has a diamond shape, each of the first and second touch electrodes 1011 and 1021 and the first and second metal mesh patterns 1012 and 1022 may be formed so as to have a diamond shape. In addition, each of the first and second segment electrodes 1013*a*, 1013*b*, 1023*a*, and 1023*b* that contact the intersection of the first and second metal mesh patterns 1012 and 1022 may also have a diamond shape. Since each of the elements constituting the first and second touch electrodes 1011 and 1021, including the first and second metal mesh patterns 1012 and 1022, has a diamond shape, it is possible to prevent the metal mesh patterns from being visible. The first and second metal mesh patterns 1012 and 1022 do not overlap the opening in each pixel but are disposed so as to overlap a non-display region or a black matrix of each pixel, thereby minimizing the visibility of the metal mesh patterns.

Nevertheless, the first and second metal mesh patterns 1012 and 1022 may be visible to a viewer depending on the viewing angle of the viewer at an arbitrary viewing position. As a result, the first and second metal mesh patterns 1012 and 1022 are visible at a viewing angle equal to or greater than a predetermined level, whereby a luminance viewing angle and a color viewing angle are reduced. In the embodiment of the present invention, each of the first and second floating units 1014 and 1024 is made of a transparent conductive material, whereby it is possible to minimizing the visibility of the first and second metal mesh patterns 1012 and 1022 even when the viewing angle is changed.

Meanwhile, the touch panel according to the embodiment of the present invention includes first floating units 1014*a* and 1014*b* electrically isolated from the first touch electrode 1011 and second floating units 1024*a* and 1024*b* electrically isolated from the second touch electrode 1021. The first floating units 1014*a* and 1014*b* reduce the effective electrode area of the first touch electrode 1011, thereby reducing parasitic capacitance between a finger and the first touch electrode 1011. In addition, the second floating units 1024*a* and 1024*b* reduce the effective electrode area of the second touch electrode 1021, thereby reducing parasitic capacitance between the finger and the second touch electrode 1021. In the touch panel according to the embodiment of the present invention, therefore, a retransmission phenomenon may be reduced. The retransmission phenomenon may be further reduced as the area of the floating units is increased. If the area of the floating units is too large, however, the area of the touch electrode is excessively reduced, whereby touch sensitivity may be reduced. In the touch panel according to the present invention, therefore, a predetermined area ratio of the floating units to the touch electrodes may be set in order to maintain touch sensitivity while solving the problem of retransmission. For example, the area ratio of the floating units relative to the touch electrodes 1011 and 1021 may be about 10 to 65%.

In the touch panel according to the present invention, each of the first and second metal mesh patterns 1012 and 1022 may be made of any one selected from the group consisting of molybdenum, aluminum, chrome, gold, titanium, neodymium, and copper or an alloy thereof. Since the resistance of each of the first and second metal mesh patterns 1012 and 1022 is low, the RC delay of the touch panel may be reduced. Furthermore, since a metal material exhibits high flexibility, the touch panel according to the present invention may be applied to a flexible display device.

In addition, when the touch panel according to the present invention includes the first and second segment electrodes 1013 and 1023 provided so as to contact the first and second metal mesh patterns 1012 and 1022, the effective capacitance of each of the first and second touch electrodes 1011 and 1021 is increased, since each segment electrode has a touch electrode surface, whereby the touch sensitivity of the touch panel is improved.

Figure 4:
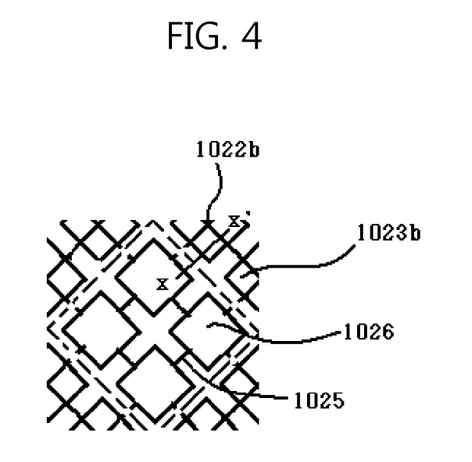
FIG. 4 is an enlarged plan view showing region B of FIG. 3, illustrating the detailed shape of floating units according to one embodiment of the present disclosure.

FIG. 4 is an enlarged plan view showing region B of FIG. 3, illustrating the detailed shape of the first and second floating units 1014 and 1024. The second floating unit 1024*b* shown in FIG. 4 is provided in the second touch electrode 1021, and has the same structure as the floating units 1014*a* and 1014*b* provided in the first touch electrode 1011.

Referring to FIG. 4, the second floating unit 1024*b* includes transparent conductive patterns 1025 arranged while intersecting in the first and second directions and a third segment electrode 1026 disposed in a contact state between the transparent conductive patterns 1025. The third segment electrode 1026 may be omitted depending on the design. In this case, the transparent conductive patterns 1025 intersect in the third and fourth directions so as to be connected in a line, like the shape of the first and second line electrodes 1031 and 1032.

Figure 5:
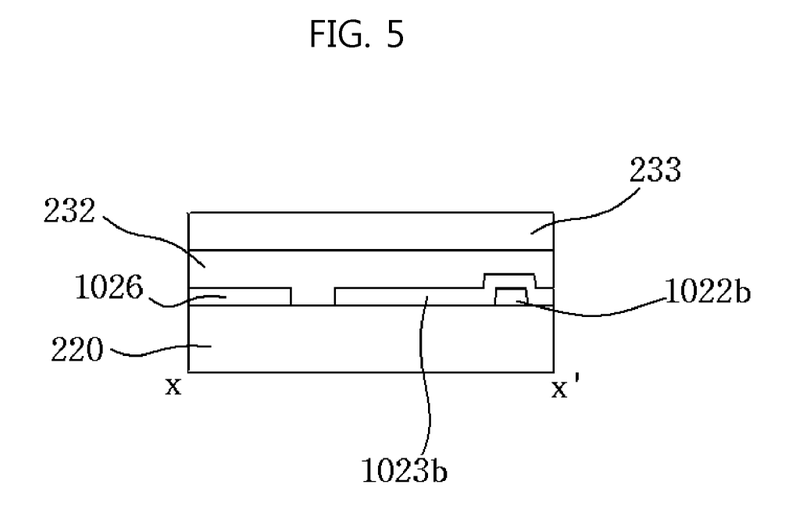
FIG. 5 is a sectional view taken along line x-x' of FIG. 4, illustrating a touch electrode array according to one embodiment of the present disclosure.

FIG. 5 is a sectional view taken along line x-x' of FIG. 4, illustrating the touch electrode array 230. The structure outside the buffer layer 220 is omitted for the sake of convenience. In FIG. 5, only the second floating unit 1024b of the second touch electrode 1021 is shown. However, the first floating units 1014a and 1014b of the first touch electrode 1011 also have the same section.

Referring to FIG. 5, the second metal mesh pattern 1022b is formed on the buffer layer 220. The second segment electrode 1023b is formed in a contact fashion at the intersection of the line electrodes of the second metal mesh pattern 1022b. The transparent conductive pattern 1025 and the third segment electrode 1026 of the second floating unit 1024b are formed simultaneously when the second segment electrode 1023b is formed. Since the transparent conductive pattern 1025 and the third segment electrode 1026 are made of a transparent conductive material, such as ITO, IZO, IGZO, or ZnO, as described above, the transparent conductive pattern 1025 and the third segment electrode 1026 may be formed simultaneously.

An interlayer dielectric film 232 is formed on the entire surface of the buffer layer 220, including the second metal mesh pattern 1022b and the transparent conductive pattern 1025 and the third segment electrode 1026 of the second floating unit 1024b. A passivation layer 233 is further formed on the interlayer dielectric film 232.

In the sectional view of FIG. 5, the buffer layer 220 is disposed on the lower side. When the touch electrode array 230 is actually laminated to the organic light-emitting array 150 and the passivation layer 160, however, the structure of FIG. 5 is reversed. That is, the actual section of the touch electrode array 230 taken along line x-x' has a horizontally-reversed form of the structure of FIG. 5.

As can be seen from FIGS. 4 and 5, the second floating unit 1024b is electrically isolated from the second metal mesh pattern 1022b. As described above, therefore, the floating unit reduces the effective area of the touch electrode, thereby reducing parasitic capacitance and the retransmission phenomenon afflicting the touch panel. In addition, since the floating unit is made of a transparent conductive material, the floating unit is not visible at any viewing angle, whereby the color viewing angle and the luminance viewing angle are increased further than in the case in which the second floating unit 1024b has a metal mesh pattern.

Figure 6A:
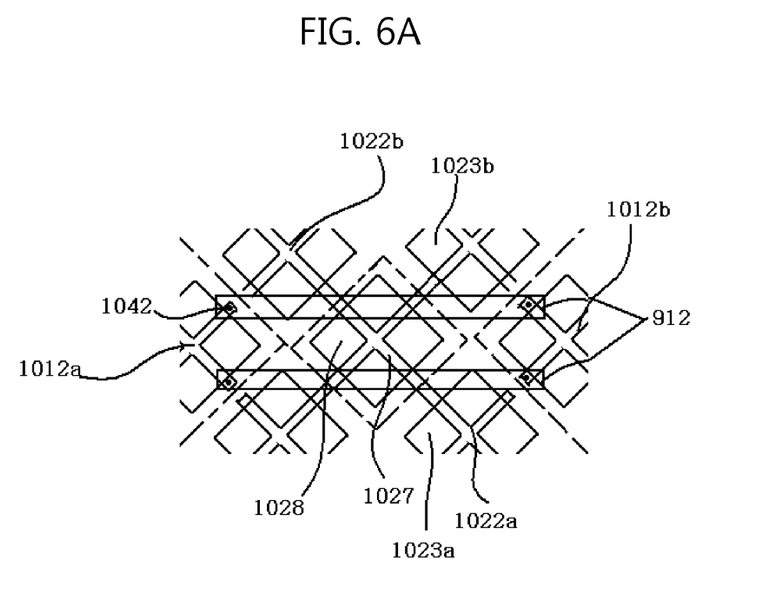
FIGS. 6A and 6B are enlarged plan views showing region C of FIG. 3, illustrating the connection structure of a bridge and a connection mesh pattern according to one embodiment of the present disclosure.
Figure 6B:
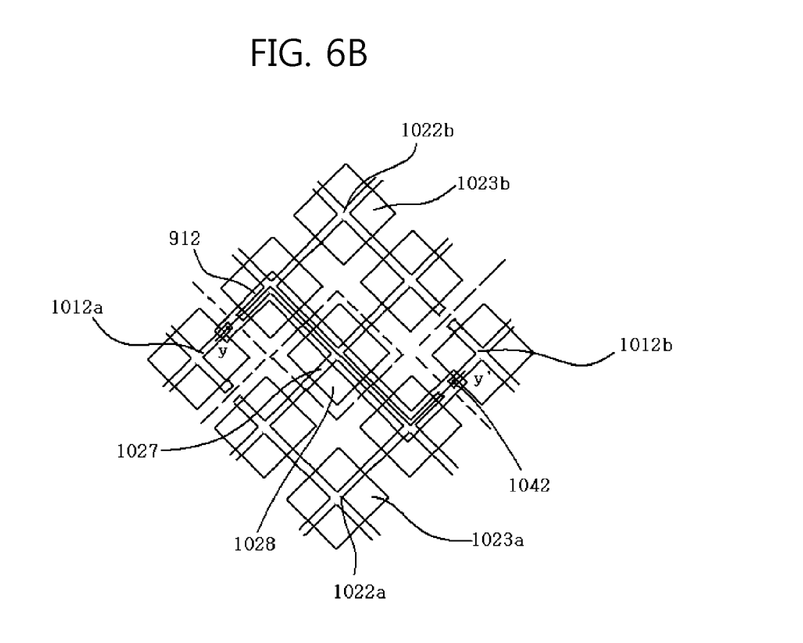

FIGS. 6A and 6B are enlarged plan views showing region C of FIG. 3, illustrating the connection structure of the bridge 912 and the connection mesh pattern 1027.

As shown in FIG. 6A, two first touch electrodes adjacent to each other in the first direction are connected to each other via the bridge 912, and two second touch electrodes adjacent to each other in the second direction are connected to each other via the connection mesh pattern 1027. The connection mesh pattern 1027 is formed on the same layer as the first and second metal mesh patterns 1012a, 1012b, 1022a, and 1022b, and is made of the same material as the first and second metal mesh patterns 1012a, 1012b, 1022a, and 1022b. The connection mesh pattern 1027 extends from the third and fourth line electrodes constituting the second metal mesh patterns 1022a and 1022b, and is formed in a shape in which two line electrodes intersect.

Consequently, the connection mesh pattern 1027 has a structure in which two second metal mesh patterns 1022a and 1022b adjacent to each other in the second direction are connected to each other using two line electrodes. However, the present invention is not limited thereto.

The bridge 912 is electrically isolated from the connection mesh pattern 1027. As shown in FIG. 6B, the bridge 912 is formed so as to have a shape overlapping with the position of the connection mesh pattern 1027. Like the connection mesh pattern 1027, which is formed in a shape in which two line electrodes intersect, the bridge 912 may be formed so as to overlap the position of the two line electrodes constituting the connection mesh pattern 1027. The bridge 912 is formed so as to overlap the connection mesh pattern 1027 and to overlap even a portion of the second metal mesh patterns 1022a and 1022b and a portion of the first metal mesh patterns 1012a and 1012b. In addition, the bridge 912 is connected to the first metal mesh patterns 1012a and 1012b via contact holes 1042. The bridge 912 may be made of the same material as the first and second metal mesh patterns 1012 and 1022. A plurality of bridges 912 may be provided.

This will be described in more detail with reference to FIG. 7.

Figure 7:
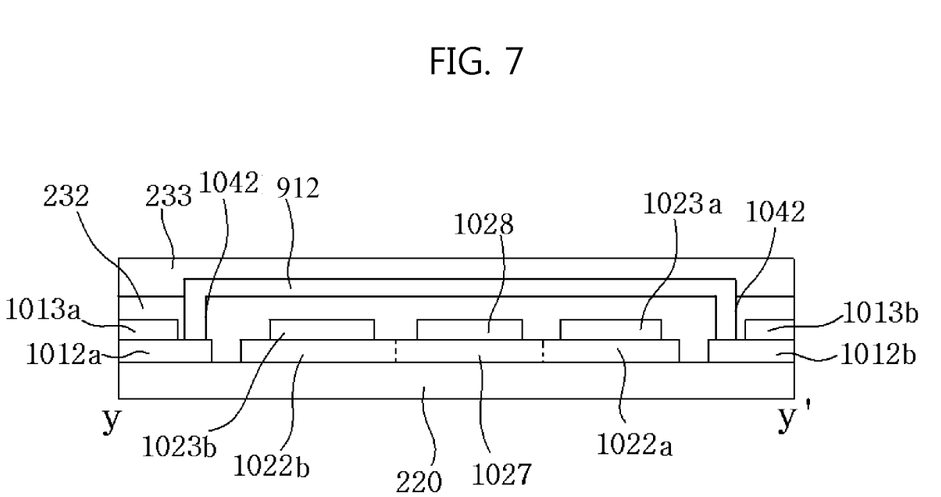
FIG. 7 is a sectional view of a touch electrode array taken along line y-y' of FIG. 6 according to one embodiment of the present disclosure.

FIG. 7 is a sectional view of the touch electrode array 230 taken along line y-y' of FIG. 6. The structure outside the buffer layer 220 is omitted for the sake of convenience.

Referring to FIG. 7, the first metal mesh patterns 1012a and 1012b, the second metal mesh patterns 1022a and 1022b, and the connection mesh pattern 1027, which connects the second metal mesh patterns 1022a and 1022b, are formed on the buffer layer 220.

First segment electrodes 1013a and 1013b may be further provided so as to contact the first metal mesh patterns 1012a and 1012b. In addition, second segment electrodes 1023a and 1023b may be further provided so as to contact the second metal mesh patterns 1022a and 1022b, and a fourth segment electrode 1028 may be further provided so as to contact the connection mesh pattern 1027.

The interlayer dielectric film 232 is formed on the entire surface of the buffer layer 220, including the first and second metal mesh patterns 1012 and 1022 and the first and second segment electrodes 1013 and 1023. The interlayer dielectric film 232 is provided with contact holes 1042, through which two adjacent first metal mesh patterns 1012a and 1012b are exposed. The bridge 912 is formed on the interlayer dielectric film 232 so as to connect the two contact holes 1042.

The passivation layer 233 is disposed on the interlayer dielectric film 232, including the bridge 912.

Actually, the touch electrode array 230 shown in FIG. 7 is laminated to the organic light-emitting array 150 and the passivation layer 160 in the reversed state. In actuality, therefore, the touch electrode array 230 shown in FIG. 7 has the reverse form of the structure of FIG. 7.

As described above, the connection mesh pattern 1027 extends from the second metal mesh patterns 1022a and 1022b so as to have a shape in which two line electrodes intersect. That is, the connection mesh pattern 1027 may also be linearly formed in a non-display region or a black matrix region of each pixel so as not to overlap an opening region of each pixel, thereby minimizing the visibility of the connection mesh pattern 1027.

The bridge 912 also has a linear structure that is bent so as to overlap the first and second metal mesh patterns and the connection mesh pattern. Consequently, the bridge 912 is also formed in a non-display region or a black matrix region of each pixel so as not to overlap an opening region of each pixel, thereby minimizing the visibility of the bridge to a viewer.

Meanwhile, in FIGS. 6 and 7, the bridge 912 is shown as directly connecting the first metal mesh patterns. Alternatively, the bridge 912 may be connected to the first segment electrodes on the first metal mesh patterns so as to electrically connect adjacent first touch electrodes.

Figure 8:
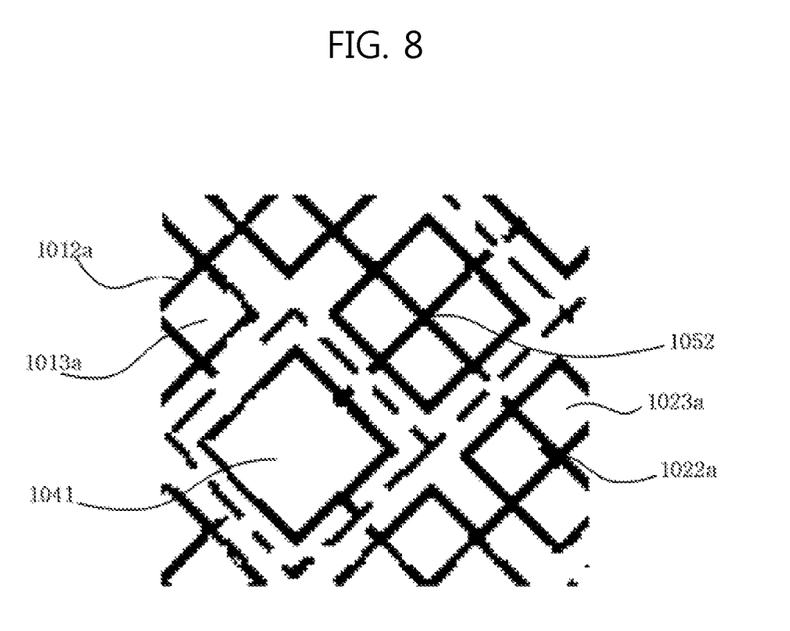
FIG. 8 is an enlarged plan view region D of FIG. 3, illustrating the interface between a first touch electrode and a second touch electrode according to one embodiment of the present disclosure.

FIG. 8 is an enlarged plan view region D of FIG. 3, illustrating the interface between the first touch electrode 1011 and the second touch electrode 1021.

As shown in FIG. 8, the first metal mesh pattern 1012*a* includes at least one protrusion 1042 protruding from the interface with the second metal mesh pattern 1022*a* of the second touch electrode 1021 toward the second metal mesh pattern 1022*a* and having an intersection of the first and second line electrodes 1031 and 1032. A fifth segment electrode 1041 may be further provided at the intersection of the protrusions 1042.

Two first touch electrodes 1011 adjacent to each other in the first direction are connected to each other via the bridge 912, and two second touch electrodes 1021 adjacent to each other in the second direction are connected to each other via the connection mesh pattern 1027. At this time, the second touch electrode 1021 of each second electrode 102 may be further provided with a connection mesh pattern 1027 and a fourth segment electrode 1028, whereby the second electrode 102 may have a larger effective area than the first electrode 101 in the designed structure thereof. In this case, the effective area of the first touch electrode 1011 constituting the first electrode 101 may be increased in order to improve touch sensitivity.

In order to increase the effective area of the first touch electrode 1011, the first metal mesh pattern 1012*a* constituting the first touch electrode 1011 includes a protrusion 1052 protruding toward the second metal mesh pattern 1022*a*, and the second metal mesh pattern 1022*b* is formed in a structure having therein a recess corresponding to the protrusion 1052. That is, since the protrusion 1052 is included in the first metal mesh pattern 1012*a*, the effective area of the first electrode 101 and the second electrode 102 is adjusted, whereby touch sensitivity is improved.

Meanwhile, in order to further improve luminance and viewing angle characteristics, at least one floating segment electrode 1051 may be provided between the first metal mesh pattern 1012*a* and the second metal mesh pattern 1022*a*. The floating segment electrode 1051 may also be made of a transparent conductive material, such as ITO, IZO, IGZO, or ZnO. The floating segment electrode 1051 may be provided at each first metal mesh pattern 1012*a*. The floating segment electrode 1051 may be formed so as to include transparent conductive patterns and a segment electrode disposed therebetween, like the first and second floating units 1014 and 1024. However, the present invention is not limited thereto.

In a display device to which the touch electrode array 230 is applied through the floating segment electrodes 1051, further improvement of luminance and viewing angle characteristics may be expected.

Figure 9A:
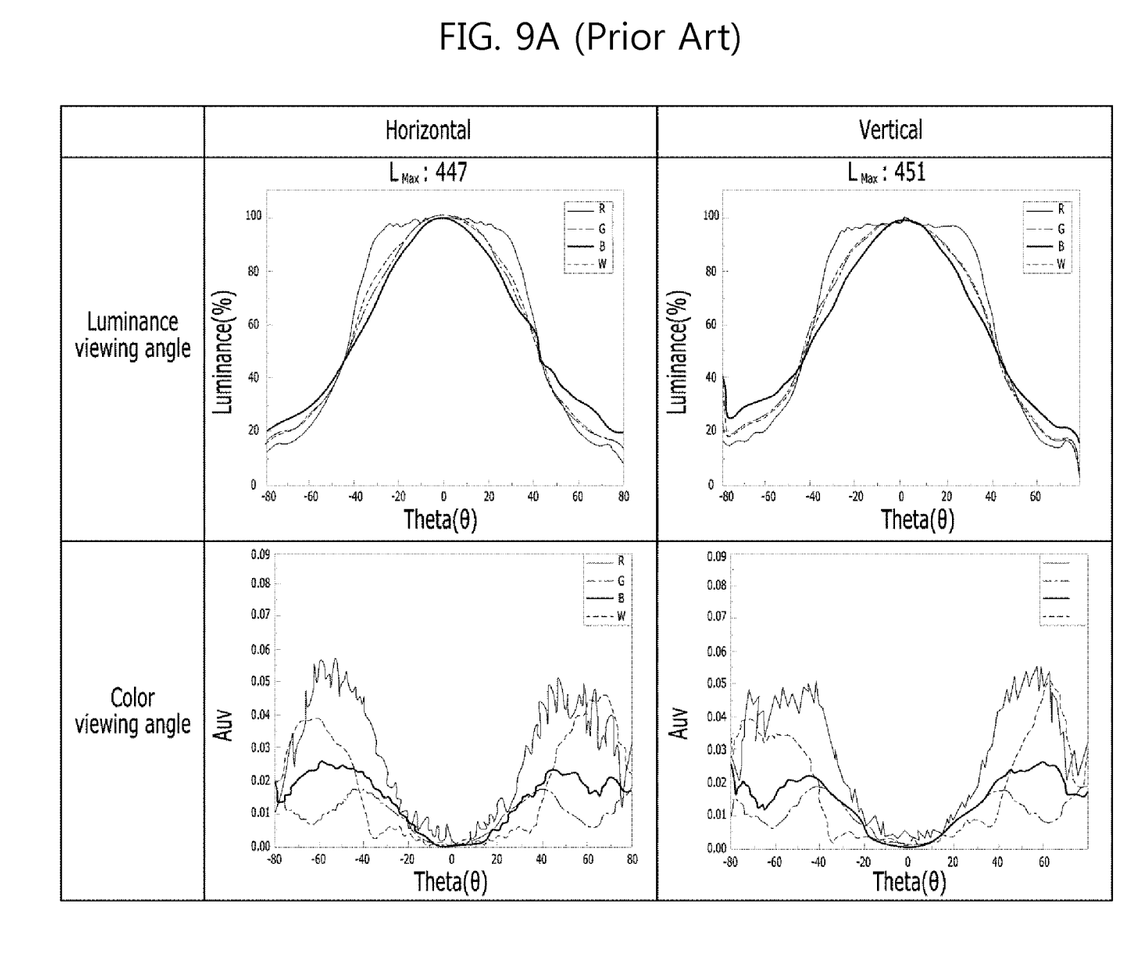
FIG. 9A is a graph showing the luminance and color viewing angle characteristics of an organic light-emitting display device to which a conventional touch panel is applied.
Figure 9B:
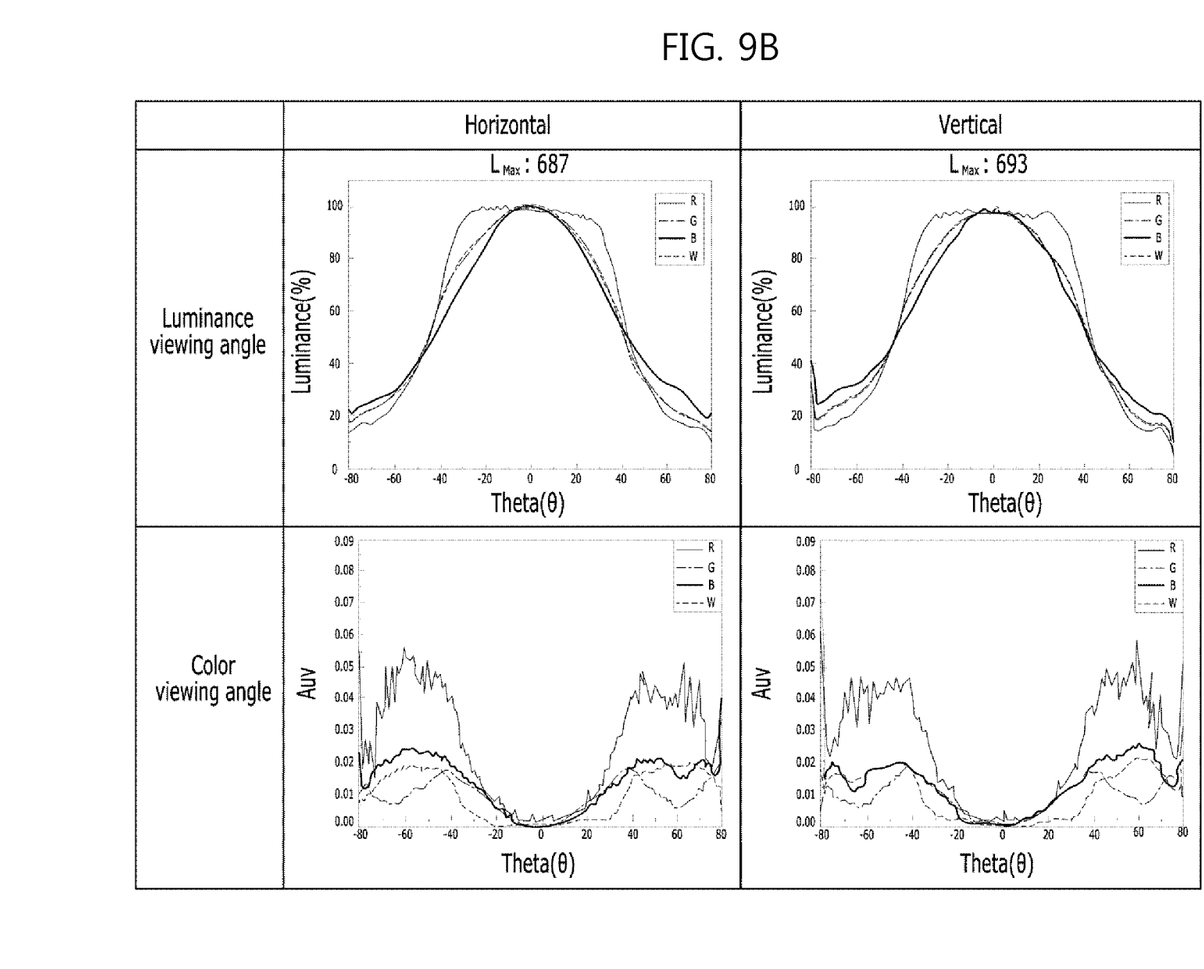
FIG. 9B is a graph showing the luminance and color viewing angle characteristics of an organic light-emitting display device to which a touch panel according to the present invention is applied.

FIG. 9B is a graph showing the luminance and color viewing angle characteristics of an organic light-emitting display device to which a conventional touch panel is applied, and FIG. 9B is a graph showing the luminance and color viewing angle characteristics of an organic light-emitting display device to which the touch panel according to the present invention is applied.

As shown in FIGS. 9A and 9B, it can be seen that the maximum luminance of the organic light-emitting display device to which the touch panel according to the present invention is applied is higher than that of the organic light-emitting display device to which the conventional touch panel is applied, whereby a luminance decrease phenomenon due to an increase in the viewing angle is also reduced.

In addition, it can be seen that a change of color coordinates $\Delta U'V'$ due to a change of the viewing angle of the organic light-emitting display device to which the touch panel according to the present invention is applied is greatly lower than that of the organic light-emitting display device to which the conventional touch panel is applied.

Consequently, the organic light-emitting display device to which the touch panel according to the present invention is applied has effects in that luminance and the luminance viewing angle are increased and a change of color coordinates due to a change in the viewing angle is minimized, thereby improving color viewing angle characteristics, compared to the conventional art.

As is apparent from the above description, the present invention has the following effects. When each pixel has a diamond shape and each of the first and second touch electrodes including the first and second metal mesh patterns has a diamond shape, it is possible to prevent the metal mesh patterns from being visible. The first and second metal mesh patterns do not overlap the opening in each pixel but are disposed so as to overlap the non-display region or the black matrix of each pixel, thereby minimizing visibility of the metal mesh patterns.

In the touch panel according to the present invention, each of the first and second floating units is made of a transparent conductive material, whereby it is possible to minimize the visibility of the metal mesh patterns even when the viewing angle is changed.

Meanwhile, the touch panel according to the present invention includes first floating units electrically isolated from the first touch electrode and second floating units electrically isolated from the second touch electrode. The first floating units reduce the effective electrode area of the first touch electrode, thereby reducing parasitic capacitance between a finger and the first touch electrode. In addition, the second floating units reduce the effective electrode area of the second touch electrode, thereby reducing parasitic capacitance between the finger and the second touch electrode. In the touch panel according to the embodiment of the present invention, therefore, a retransmission phenomenon may be reduced.

Since the resistance of each of the first and second metal mesh patterns is low, the RC delay of the touch panel may be reduced. Furthermore, since a metal material exhibits high flexibility, the touch panel according to the present invention may be applied to a flexible display device.

In addition, when the touch panel according to the present invention includes segment electrodes provided so as to contact the first and second metal mesh patterns, the effective capacitance of each of the first and second touch electrodes is increased, since each segment electrode has a touch electrode surface, whereby the touch sensitivity of the touch panel is improved.

The connection mesh pattern extends from the second metal mesh patterns so as to have a shape in which two line electrodes intersect. That is, the connection mesh pattern may also be linearly formed in the non-display region or the black matrix region of each pixel so as not to overlap the opening region of each pixel, thereby minimizing the visibility of the connection mesh pattern.

The bridge also has a linear structure that is bent so as to overlap the first and second metal mesh patterns and the connection mesh pattern. Consequently, the bridge is also formed in the non-display region or the black matrix region of each pixel so as not to overlap the opening region of each pixel, thereby minimizing the visibility of the bridge to a viewer.

In the touch panel according to the present invention, the protrusion is included in the first metal mesh pattern, whereby the effective area of the first and second electrodes is adjusted and touch sensitivity is improved.

Additionally, in the touch panel according to the present invention, a greater improvement in luminance and viewing angle characteristics may be expected owing to the floating segment electrodes.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A touch panel comprising:
    a plurality of first electrodes arranged on a substrate in a first direction; and
    a plurality of second electrodes arranged in a second direction that intersects the first direction, the plurality of second electrodes electrically isolated from the plurality of first electrodes,
    wherein each of the plurality of first electrodes comprises a first touch electrode, the first touch electrode comprising a first metal mesh pattern having a lattice structure and a first floating unit, the first floating unit being electrically isolated from the first metal mesh pattern, wherein the first metal mesh pattern comprises a plurality of first line electrodes and a plurality of second line electrodes, the plurality of first line electrodes and the plurality of second line electrodes intersecting in a third direction and a fourth direction to form a lattice structure;
    wherein each of the plurality of second electrodes comprises a second touch electrode, the second touch electrode comprising a second metal mesh pattern having a lattice structure and a second floating unit electrically isolated from the second metal mesh pattern, wherein the second metal mesh pattern comprises a plurality of third line electrodes and a plurality of fourth line electrodes, the plurality of third line electrodes and the plurality of fourth line electrodes intersecting in the third direction and the fourth direction to form a lattice structure, and
    wherein the first metal mesh pattern further comprises at least one protrusion protruding from a region thereof adjacent to the second metal mesh pattern toward the second metal mesh pattern, the protrusion having an intersection of the plurality of first line electrodes and the plurality of second line electrodes.

2. The touch panel according to claim 1, wherein each of the plurality of first electrodes comprises a bridge for connecting a plurality of first touch electrodes adjacent to each other in the first direction, and each of the plurality of second electrodes comprises a connection mesh pattern for connecting a plurality of second touch electrodes adjacent to each other in the second direction.

3. The touch panel according to claim 1, further comprising:
    a first segment electrode disposed in a contact fashion at an intersection of the plurality of first line electrodes and the plurality of second line electrodes; and
    a second segment electrode disposed in a contact fashion at an intersection of the plurality of third line electrodes and the plurality of fourth line electrodes.

4. A touch panel integrated organic light-emitting display device comprising:
    a thin film transistor array disposed on a substrate;
    an organic light-emitting array on the thin film transistor array; and
    a passivation layer and a touch electrode array on the organic light-emitting array,
    wherein the touch electrode array comprises:
        a plurality of first electrodes arranged in a first direction; and
        a plurality of second electrodes arranged in a second direction that intersects the first direction, the plurality of second electrodes being electrically isolated from the plurality of first electrodes,
        wherein each of the plurality of first electrodes comprises a first touch electrode, the first touch electrode comprising a first metal mesh pattern having a lattice structure and a first floating unit, the first floating unit being electrically isolated from the first metal mesh pattern, and
        wherein each of the plurality of second electrodes comprises a second touch electrode, the second touch electrode comprising a second metal mesh pattern having a lattice structure and a second floating unit, the second floating unit being electrically isolated from the second metal mesh pattern,
        wherein the first metal mesh pattern comprises:
            a plurality of first line electrodes and a plurality of second line electrodes, the plurality of first line electrodes and the plurality of second line electrodes intersecting in a third direction and a fourth direction to form the lattice structure, and
            at least one protrusion protruding from a region thereof adjacent to the second metal mesh pattern toward the second metal mesh pattern, the at least one protrusion having an intersection of the plurality of first line electrodes and the plurality of second line electrodes.

5. The touch panel integrated organic light-emitting display device of claim 4, wherein the second metal mesh pattern comprises a plurality of third line electrodes and a plurality of fourth line electrodes, the plurality of third line electrodes and the plurality of fourth line electrodes intersecting in the third direction and the fourth direction to form a lattice structure.

6. The touch panel integrated organic light-emitting display device of claim 5, further comprising:
    a first segment electrode disposed in a contact fashion at an intersection of the plurality of first line electrodes and the plurality of second line electrodes; and
    a second segment electrode disposed in a contact fashion at an intersection of the plurality of third line electrodes and the plurality of fourth line electrodes.

7. The touch panel integrated organic light-emitting display device of claim 4, wherein each of the plurality of first electrodes comprises a bridge for connecting a plurality of first touch electrodes adjacent to each other in the first direction, and wherein each of the plurality of second electrodes comprises a connection mesh pattern for connecting a plurality of second touch electrodes adjacent to each other in the second direction.

8. The touch panel integrated organic light-emitting display device of claim 7, further comprising:
an interlayer dielectric film disposed to cover the plurality of first electrodes and the plurality of second electrodes, the interlayer dielectric film being provided with a plurality of contact holes, through which a portion of an edge region of the first metal mesh pattern is exposed, wherein the bridge electrically connects two first metal mesh patterns adjacent to each other in the first direction through the plurality of contact holes.

9. The touch panel integrated organic light-emitting display device of claim 8, wherein the bridge is disposed to overlap the second metal mesh pattern and the connection mesh pattern.

10. The touch panel integrated organic light-emitting display device of claim 4, further comprising:
a segment electrode disposed in a contact fashion at an intersection of the at least one protrusion.

11. The touch panel integrated organic light-emitting display device of claim 4, further comprising:
a bonding layer between the organic light emitting array and the touch electrode array.

* * * * *